United States Patent
Lee et al.

(10) Patent No.: US 8,832,929 B2
(45) Date of Patent: Sep. 16, 2014

(54) METHOD OF MANUFACTURING A FLEXIBLE PRINTED CIRCUIT BOARD

(75) Inventors: Kyung Ho Lee, Gyunggi-do (KR); Se Min Oh, Gyunggi-do (KR); Chang Hwan Choi, Gyunggi-do (KR); Choon Keun Lee, Gyunggi-do (KR); Jeong Yeol Moon, Kyungsangnam-do (KR); Jong Rip Kim, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 7 days.

(21) Appl. No.: 13/472,937

(22) Filed: May 16, 2012

(65) Prior Publication Data

US 2012/0291272 A1    Nov. 22, 2012

Related U.S. Application Data

(62) Division of application No. 12/213,570, filed on Jun. 20, 2008, now Pat. No. 8,198,542.

(30) Foreign Application Priority Data

Dec. 18, 2007 (KR) .................. 10-2007-0133299

(51) Int. Cl.
*H05K 3/00* (2006.01)
*H05K 1/02* (2006.01)

(52) U.S. Cl.
CPC ........... *H05K 1/028* (2013.01); *H05K 1/0218* (2013.01); *H05K 2201/0352* (2013.01); *H05K 2201/09736* (2013.01); *H05K 2201/0191* (2013.01); *H05K 2201/0715* (2013.01)
USPC ............... 29/830; 29/825; 29/829; 174/250; 174/254; 174/258; 361/748; 361/749; 361/750; 361/751; 361/760

(58) Field of Classification Search
USPC ........... 29/825, 829, 830; 174/250, 254, 258; 361/748–751, 760, 795
See application file for complete search history.

(56) References Cited

U.S. PATENT DOCUMENTS

| 5,219,640 | A | | 6/1993 | Gazit et al. | |
|---|---|---|---|---|---|
| 5,296,651 | A | * | 3/1994 | Gurrie et al. | .................. 174/254 |

(Continued)

FOREIGN PATENT DOCUMENTS

| CN | 1874649 A | 12/2006 |
|---|---|---|
| JP | 7-283494 | 10/1995 |

(Continued)

OTHER PUBLICATIONS

Chinese Office Action issued Jun. 7, 2010 in corresponding Chinese Patent Application 200810128018.4.

(Continued)

*Primary Examiner* — Peter DungBa Vo
*Assistant Examiner* — Azm Parvez

(57) ABSTRACT

A method of manufacturing a flexible printed circuit board including determining an elastic modulus of a conductive portion and an elastic modulus of first and second dielectric portions, determining a thickness of the conductive portion and the first and second dielectric portions so that a neutral plane is located within a predetermined range of the thickness of the conductive portion, the neutral plane being substantially free from tension or compression in response to bending of the flexible printed circuit board, and insulating the conductive portion according to the determined thickness and the determined elastic modulus.

2 Claims, 8 Drawing Sheets

(56) References Cited

U.S. PATENT DOCUMENTS

| | | | | |
|---|---|---|---|---|
| 5,583,320 A * | 12/1996 | Eriguchi et al. | | 174/254 |
| 6,356,451 B1 * | 3/2002 | Nakagawa et al. | | 361/760 |
| 6,737,589 B2 * | 5/2004 | Adachi et al. | | 174/254 |
| 7,629,538 B2 * | 12/2009 | Heisen et al. | | 174/254 |
| 8,198,542 B2 * | 6/2012 | Lee et al. | | 174/254 |
| 2002/0189854 A1 * | 12/2002 | Crumly | | 174/254 |
| 2005/0018409 A1 * | 1/2005 | Hirakata | | 361/752 |
| 2005/0122700 A1 * | 6/2005 | Kim et al. | | 361/795 |
| 2006/0132027 A1 * | 6/2006 | Gao | | 313/506 |
| 2011/0307214 A1 * | 12/2011 | Saitou et al. | | 702/155 |

FOREIGN PATENT DOCUMENTS

| | | |
|---|---|---|
| JP | 2009-017448 | 1/2009 |
| KR | 10-2004-005746 | 1/2004 |
| KR | 10-2005-0040379 | 5/2005 |

OTHER PUBLICATIONS

Japanese Office Action issued Sep. 14, 2010 in corresponding Japanese Patent Application 2008-166284.

Restriction Requirement mailed Jul. 7, 2011, issued in corresponding U.S. Appl. No. 12/213,570.

Office Action mailed Nov. 3, 2011, issued in corresponding U.S. Appl. No. 12/213,570.

Notice Allowance mailed Feb. 15, 2012, issued in corresponding U.S. Appl. No. 12/213,570.

Korean Office Action issued on Oct. 16, 2009 in corresponding Korean Patent Application 10-2007-0133299.

U.S. Appl. No. 12/213,570, filed Jun. 20, 2008, Kyung Ho Lee et al., Samsung Electro-Mechanics Co., Ltd.

Office Action issued by the U.S. Patent and Trademark Office on Jul. 5, 2013 in the related U.S. Appl. No. 13/473,248.

* cited by examiner

METHOD OF MANUFACTURING A FLEXIBLE PRINTED CIRCUIT BOARD

CROSS-REFERENCE TO RELATED APPLICATIONS

This application is a U.S. divisional application filed under 37 CFR 1.53(b) claiming priority benefit of U.S. Ser. No. 12/213,570, filed in the United States on Jun. 20, 2008, now U.S. Pat. No. 8,198,542, which claims earlier priority benefit to Korean Patent Application No. 10-2007-133299 filed with the Korean Intellectual Property Office on Dec. 18, 2007, the disclosures of which are incorporated herein by reference.

BACKGROUND

1. Field

The present invention relates to a flexible printed circuit board (FPCB) and a manufacturing method thereof, and more particularly, to an FPCB used in various electrical and/or electronic devices such as a mobile communication device and a method of manufacturing the same.

2. Description of the Related Art

In general, an FPCB is a circuit board that is designed to conduct various complicated signals, and includes a conductor layer for conducting electrical signals and dielectric layers covering the top surface and the underside surface of the conductive layer. This type of FPCB can be manufactured to be thin and small, and is used for a thin and small electrical device such as a mobile communication device.

The FPCB has highly-flexible physical property, and thus is used for a shape-changeable electrical device. Particularly, the FPCB is used for electrical circuit connection between a body and a slide (or a foldable member) in a slide-type or folder-type mobile communication device.

That is, when the slide (or the foldable member) is moved open or closed, the FPCB flexibly bends, so that the circuit can be continuously connected.

As mentioned above, the FPCB maintains electrical circuit connection when it repeats bending since it is used in a shape-changeable device such as a mobile communication device.

However, when the FPCB is repeatedly bending, a conductor layer inside the FPCB suffers from fatigue, caused by the repeated bending. This as a result causes cracks in the conductor layer, thereby reducing the lifetime of the FPCB.

SUMMARY

The present invention has been made to solve the foregoing problems with the prior art, and therefore the present invention is directed to an FPCB and a method of manufacturing the same, in which an electrical signal-conductive portion of the FPCB is subjected to little stress so as not to be broken by fatigue in spite of repeated bending of the FPCB, thereby increasing the lifetime of the FPCB.

According to an aspect of the present invention, the FPCB includes a first dielectric portion forming a dielectric layer; a second dielectric portion forming a dielectric layer opposite the first dielectric portion; and a conductive portion conducting electrical signals and having a neutral plane, wherein the neutral plane is located within a predetermined range of the thickness of the conductive portion, and has substantially zero strain due to bending between the first and second dielectric portions.

On both sides of the neutral plane, the first dielectric portion is substantially subjected to tension and the second dielectric portion is substantially subjected to compression.

According to another aspect of the present invention, the FPCB includes a first dielectric portion subjected to tension in response to bending; a second dielectric portion subjected to compression in response to bending; and a conductive portion conducting electrical signals, and having a neutral plane, the neutral plane is within a predetermined range of the thickness of the conductive portion, and forms a substantial interface of tension and compression between the first and second dielectric portions.

Each of the first and second dielectric portions may include at least one dielectric layer.

Here, a geometric center, obtained by converting the thickness and the width of respective layer of the flexible printed circuit board using same elastic modulus, may be located in the predetermined range of the thickness of the conductive portion.

The position of the neutral plane may be determined according to the following Formula:

$$Y_n = (\Sigma(T_i * E_i * Y_i))/(\Sigma(T_i * E_i)), \text{ and}$$

$$\Sigma T_x < Y_n < (\Sigma T_x + T_c),$$

where $Y_n$ is a distance normally extending from a reference plane to the neutral plane, $T_i$ is the thickness of a respective layer of the flexible printed circuit board, $E_i$ is an elastic modulus of a material placed in the respective layer of the flexible printed circuit board, $Y_i$ is a distance normally extending from the reference plane to the geometric center of the respective layer, $T_x$ is the thickness of the respective layer under the conductive portion, $T_c$ is the thickness of the conductive portion, and the reference plane is an underside of the flexible printed circuit board.

The neutral plane may be located in a range determined by the following Formula:

$$(\Sigma T_x + 0.2 T_c) \leq Y_n \leq (\Sigma T_x + 0.8 T_c).$$

According to a further aspect of the present invention, the FPCB includes a conductive member including a conductive portion, which conducts electrical signals, and at least one dielectric layer; and a cover including a adhesive layer adhered to the conductive portion and at least one dielectric layer, wherein the thickness and the elastic modulus of the conductive member and the cover are determined so that a neutral plane is placed within a predetermined range of the thickness of conductive portion, the neutral plane being substantially free from tension or compression in response to bending of the conductive member and the cover.

The position of the neutral plane may be determined according to the following Formula:

$$Y_n = (\Sigma(T_i * E_i * Y_i))/(\Sigma(T_i * E_i)), \text{ and}$$

$$\Sigma T_x < Y_n < (\Sigma T_x + T_c)$$

where $Y_n$ is a distance normally extending from a reference plane to the neutral plane, $T_i$ is the thickness of a respective layer of the flexible printed circuit board, $E_i$ is an elastic modulus of a material placed in the respective layer of the flexible printed circuit board, $Y_i$ is a distance normally extending from the reference plane to the geometric center of the respective layer, $T_x$ is the thickness of the respective layer under the conductive portion, $T_c$ is the thickness of the conductive portion, and the reference plane is an underside of the flexible printed circuit board.

The neutral plane may be located in a range determined by the following Formula:

$$(\Sigma T_x + 0.2 T_c) \leq Y_n \leq (\Sigma T_x + 0.8 T_c).$$

According to another aspect of the present invention, the method of manufacturing an FPCB includes determining the elastic modulus of a conductive portion and the elastic modulus of first and second dielectric portions, which insulate the conductive portion; determining the thickness of the conductive portion and the first and second dielectric portions so that a neutral plane is located within a predetermined range of the thickness of the conductive portion, the neutral plane being substantially free from tension or compression in response to bending of the conductive member and the cover; and insulating the conductive portion according to the determined thickness and the determined elastic modulus.

The step of determining the thickness may design to locate a geometric center in the predetermined range of the thickness of the conductive portion, the geometric center obtained by converting the thickness and the width of respective layer of the first dielectric portion, the second dielectric portion and the conductive portion using same elastic modulus.

The thickness of the first dielectric portion, the second dielectric portion and the conductive portion may be determined according to the position of the neutral position, which is obtained by the following Formula:

$$Y_n = (\Sigma(T_i * E_i * Y_i))/(\Sigma(T_i * E_i)), \text{ and}$$

$$\Sigma T_x < Y_n < (\Sigma T_x + T_c)$$

where Yn is a distance normally extending from a reference plane to the neutral plane, Ti is the thickness of a respective layer of the flexible printed circuit board, Ei is an elastic modulus of a material placed in the respective layer of the flexible printed circuit board, Yi is a distance normally extending from the reference plane to the geometric center of the respective layer, Tx is the thickness of the respective layer under the conductive portion, Tc is the thickness of the conductive portion, and the reference plane is an underside of the flexible printed circuit board.

The step of determining the thickness may locate the neutral plane in a range determined by the following Formula:

$$(\Sigma T_x + 0.2 T_c) \leq Y_n \leq (\Sigma T_x + 0.8 T_c)$$

According to yet another aspect of the present invention, the method of manufacturing an FPCB includes adhering a cover, which includes a adhesive layer and at least one dielectric layer, to a conductive member, which includes a conductive portion and at least one dielectric layer; determining the elastic modulus and the thickness of a shield to be layered on at least one of the conductive member and the cover, so that a neutral plane is located within a predetermined range of the thickness of the conductive portion, the neutral plane forming a substantial interface of tension and compression in response to bending; and layering the shield on at least one of the conductive member and the cover, with the elastic modulus and the thickness of the shield determined so that the neutral plane is located in the conductive portion.

The shield may include a first shield layered on a top surface of the cover; and a second shield layered on an underside of the conductive member.

Here, the elastic modulus and the thickness of the shield are determined according to the following Formula:

$$Y_n = (\Sigma(T_i * E_i * Y_i))/(\Sigma(T_i * E_i)), \text{ and}$$

$$\Sigma T_x < Y_n < (\Sigma T_x + T_c)$$

where $Y_n$ is a distance normally extending from a reference plane to the neutral plane, $T_i$ is the thickness of a respective layer of the flexible printed circuit board, $E_i$ is an elastic modulus of a material placed in the respective layer of the flexible printed circuit board, $Y_i$ is a distance normally extending from the reference plane to the geometric center of the respective layer, $T_x$ is the thickness of the respective layer under the conductive portion, $T_c$ is the thickness of the conductive portion, and the reference plane is an underside of the flexible printed circuit board.

The step of determining the thickness and elastic modulus of the shield may locate the neutral plane in a range determined by the following Formula:

$$(\Sigma T_x + 0.2 T_c) \leq Y_n \leq (\Sigma T_x + 0.8 T_c)$$

In the FPCB of the present invention, even though the FPCB is repeatedly bent, the conductive portion, which conducts electrical signals, is not easily fractured by fatigue caused by stress, thereby increasing the lifetime of the FPCB. The manufacturing method of the present invention can newly manufacture an FPCB having the above-described properties, and also provide the above-describe properties to a previously-made FPCB.

BRIEF DESCRIPTION OF THE DRAWINGS

The above and other aspects, features and other advantages of the present invention will be more clearly understood from the following detailed description taken in conjunction with the accompanying drawings, in which.

DESCRIPTION OF EMBODIMENTS

Exemplary embodiments of the present invention will now be described in detail with reference to the accompanying drawings.

Figure 1:
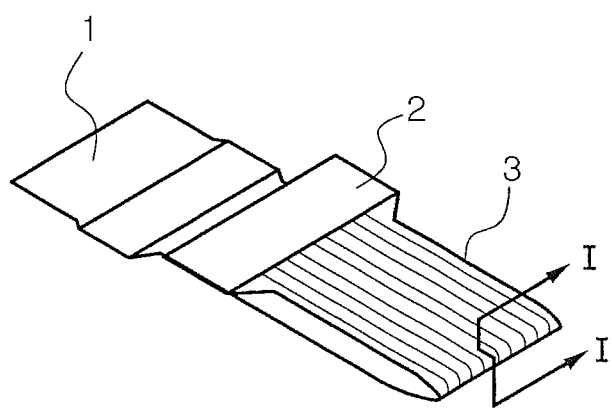
FIGS. 1 and 2 are perspective views illustrating example operations of an FPCB according to an embodiment of the present invention.
Figure 2:
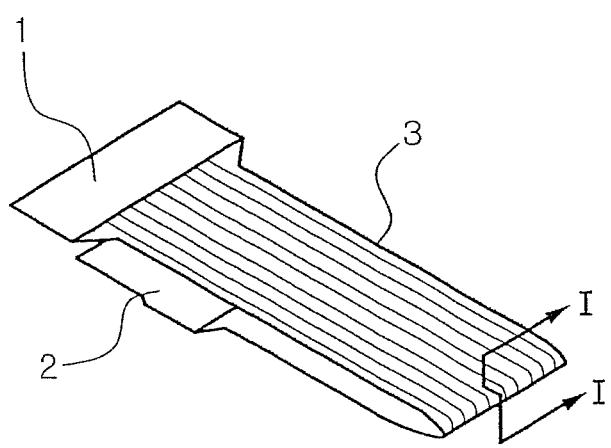

FIGS. 1 and 2 illustrate the operation of a flexible printed circuit board (FPCB) according to an embodiment of the present invention. First, the FPCB according to an embodiment of the present invention will be schematically described with reference to FIGS. 1 and 2.

The FPCB illustrated in FIGS. 1 and 2 comprises first and second connectors 1 and 2, each of which is connected to a main circuit board or an auxiliary circuit board, and a flexible portion 3, which transmits electrical signals between the connectors 1 and 2 and is bent flexibly.

The FPCB illustrated in FIGS. 1 and 2 is characterized in that it can realize various electronics, particularly compact slim devices. For example, the FPCB can be applied to a slide type mobile communication terminal.

In other words, assuming that the first connector 1 is connected to a PCB installed in a terminal body (not shown) and that the second connector 2 is connected to a slide (not shown) performing operations such as slide-up/down on the terminal body, the state illustrated in FIG. 1 can be regarded to be a slide-up state, whereas the state illustrated in FIG. 2 can be regarded to be a slide-down state.

A user repeats the slide-up and the slide-down while using the slide type mobile communication terminal. In this case, the flexible portion 3 repeats the flexure as illustrated in FIGS. 1 and 2.

In this manner, in the case in which the FPCB according to an embodiment of the present invention is bent, the flexible portion 3 is subjected to tension and compression at the same time. A detailed mechanism of the operation will be described with reference to FIG. 3.

Figure 3:
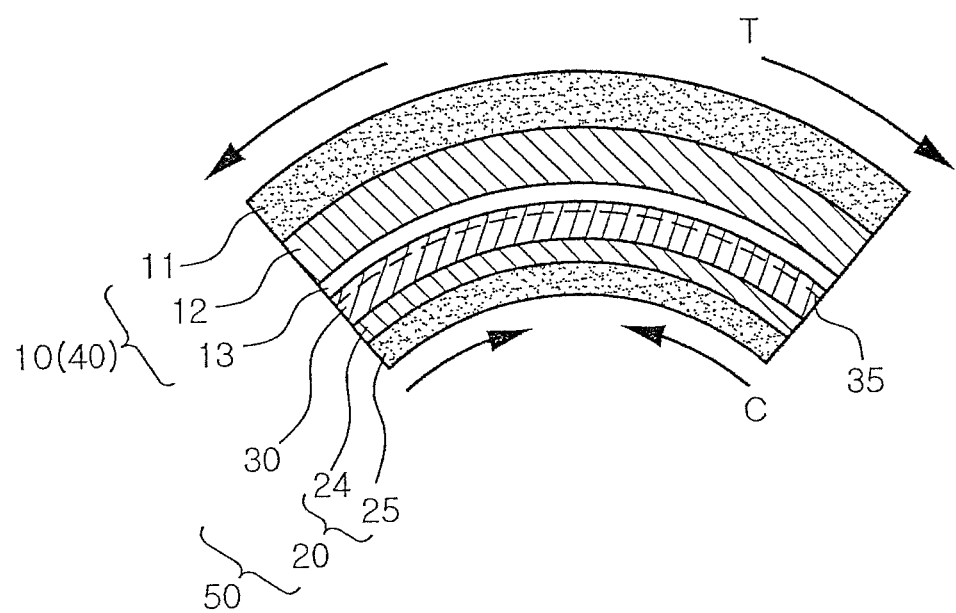
FIG. 3 is a cross-sectional view of the FPCB, taken along the line I-I in FIG. 2.

FIG. 3 is a cross-sectional view taken the line I-I of the FPCB illustrated in FIG. 1 or 2.

The FPCB is fundamentally divided into a conductive portion for transmitting electrical signals, and a dielectric portion for insulating the conductive portion. As illustrated in FIG. 3, the FPCB according to an embodiment of the present invention comprises a first dielectric portion 10, a conductive portion 30, and a second dielectric portion 20.

The first and second dielectric portions 10 and 20 are disposed with the conductive portion 30 in between, and serve to protect and insulate the conductive portion 30.

When the FPCB is bent as illustrated in FIGS. 1 and 2, tension T and compression C thereof occurs at the same time as illustrated in FIG. 3.

In other words, the tension T occurs at the first dielectric portion 10, and the compression C occurs at the second dielectric portion 20. In the embodiment illustrated in FIG. 3, the first dielectric portion 10 includes a first layer 11, a second layer 12, and a third layer 13, and the second dielectric portion 20 includes a fourth layer 24 and a fifth layer 25.

The embodiment of FIG. 3 illustrates that each of the first and second dielectric portions 10 and 20 has, but not limited to, a plurality of dielectric layers. For example, each of the first and second dielectric portions 10 and 20 may include a single dielectric layer.

More specifically, in the embodiment illustrated in FIG. 3, the first layer 11 of the first dielectric portion 10 is an electromagnetic interference (EMI) shield layer, the second layer 12 is a polyimide layer, and the third layer 13 is an adhesive layer for adhering to the conductive portion 30.

Further, the fourth layer 24 of the second dielectric portion 20 is a polyimide layer, and the fifth layer 25 is an EMI shield layer.

However, the FPCB according to an embodiment of the present invention is not essentially divided into the first dielectric portion 10, the second dielectric portion 20, and the conductive portion 30. Thus, the FPCB according to another embodiment of the present invention can be divided into a conductive member 50 and a cover 40.

The conductive member 50 includes the conductive portion 30 in addition to the fourth and fifth layers 24 and 25, both of which are stacked beneath the conductive portion 30. The cover 40 includes the first, second and third layers 11, 12 and 13, which are stacked in that order. At this time, the third layer 13 typically serves as an adhesive layer for adhering to the conductive portion 30.

Meanwhile, the embodiment illustrated in FIG. 3 includes a neutral plane 35, which is substantially subjected neither to the tension nor the compression.

Any material will be extended or contracted to a certain extent under tensile or compressive stress. However, the neutral plane 35 substantially causes neither tension nor compression, so that the strain thereof substantially becomes zero.

Here, the strain is expressed by a ratio of an original length or volume to a deformed length or volume. Since no change is caused from the neutral plane 35, the strain of the neutral plane 35 substantially becomes zero.

In other words, as illustrated in FIG. 3, when the FPCB is bent, the first dielectric portion 10 (or the cover 40) is subjected to the tension T, and the second dielectric portion 20 (or the conductive member 50, from which the conductive portion 30 is excluded) is subjected to the compression C. Further, the neutral plane 35 substantially causes neither the tension nor the compression.

Thus, according to an embodiment of the present invention, since the neutral plane 35 is disposed within the conductive portion 30, the FPCB experiences the tension and the compression to the minimum extent in spite of the repeated bending thereof, very slight deformation, and thus weak fatigue. Accordingly, the FPCB can inhibit cracks caused by the fatigue, and thus increase its life span.

In detail, the neutral plane 35 is preferably adapted to exist within a predetermined range of the thickness of the conductive portion 30. To this end, each of the first dielectric portion 10, the second dielectric portion 20 and the conductive portion 30 must be determined with respect to a thickness, an elastic modulus, etc. thereof.

A method of determining the thicknesses and the elastic moduli of the respective layers constituting the FPCB will be described with reference to FIGS. 4 and 5.

Figure 4:
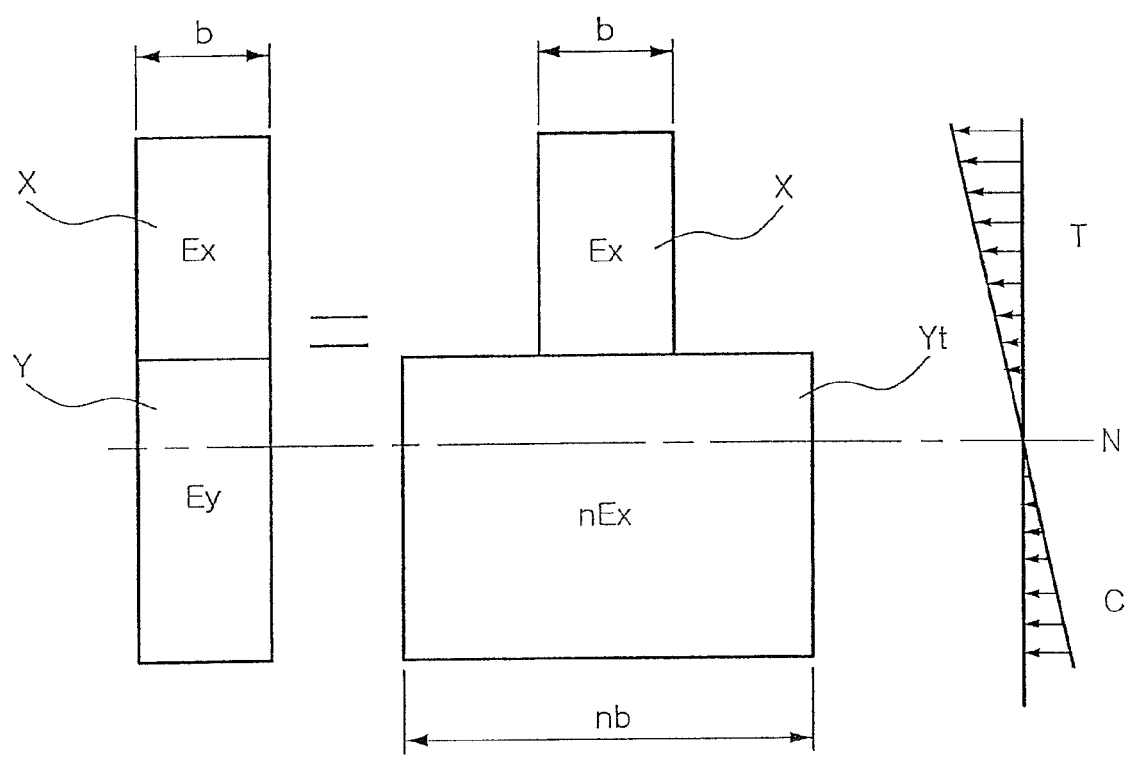
FIG. 4 is a configuration view illustrating stress distribution when an object is bent or curved.
Figure 5:
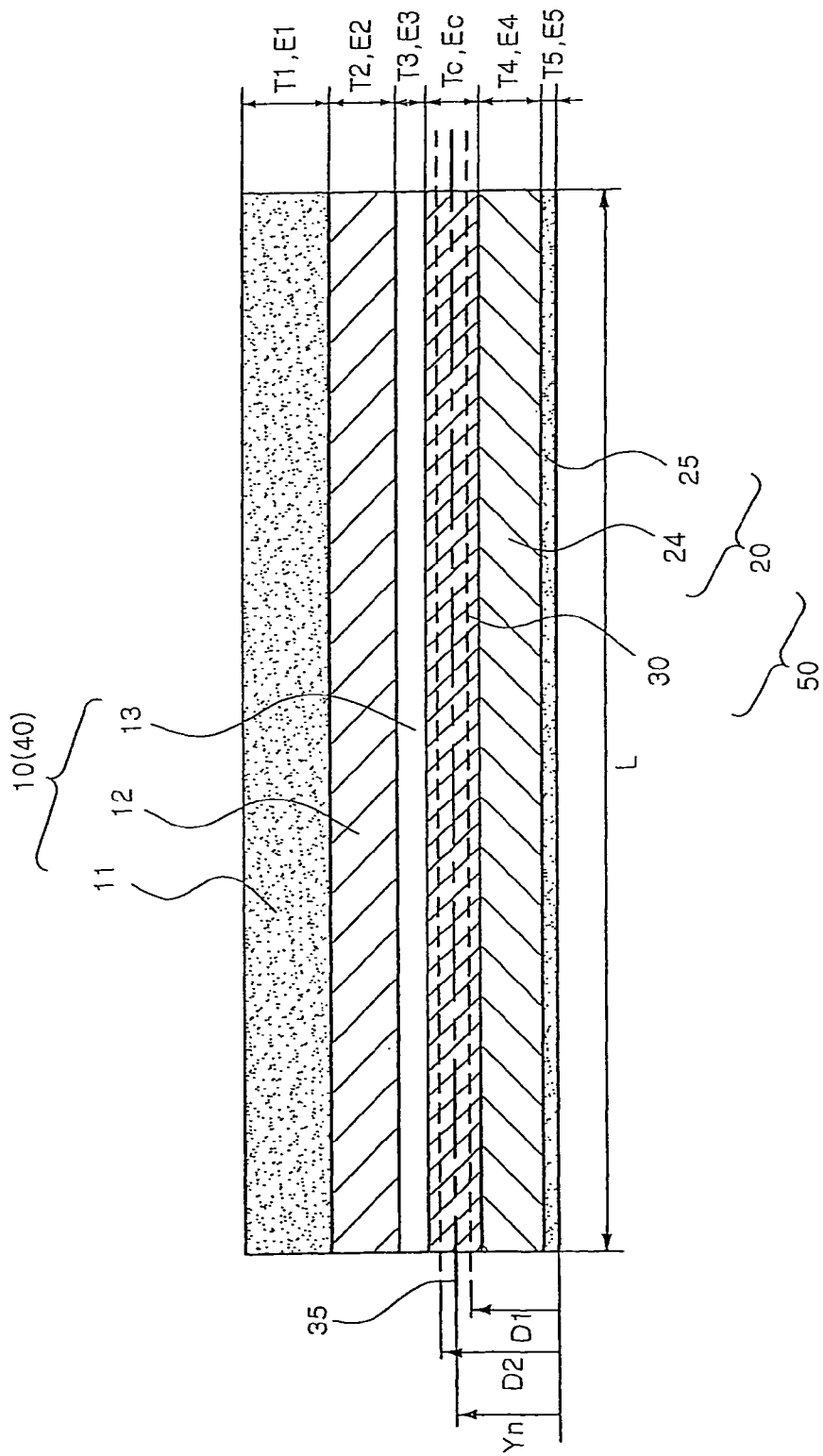
FIG. 5 is a cross-sectional view of an FPCB according to an embodiment of the present invention, illustrating physical properties of materials of respective layers of the FPCB.

FIG. 4 illustrates stress distribution when an object is bent or curved, and FIG. 5 illustrates physical properties of materials of the respective layers of an FPCB according to an embodiment of the present invention.

As illustrated in FIG. 4, it is assumed that X and Y materials are stacked, that width and elastic modulus of the X material are b and Ex respectively, and that width and elastic modulus of the Y material are b and $E_y$ respectively. When the bending occurs from top to bottom, the neutral plane N is located at a substantial interface between the tension T and the compression C.

Further, the neutral plane N is not matched with a boundary between the X and Y materials. This is because area and elastic modulus of the X material are different from those of the Y material.

Thus, as illustrated in FIG. 4, the position of the neutral plane can be easily obtained by calculation based on the elastic modulus of one material.

In other words, when calculated on the basis of the elastic modulus Ex of the X material, the width of the Y material is nb, where $n=E_y/E_x$.

The neutral plane N is a line passing through the geometric centers of the X and Y materials which are represented by the width calculated in this way.

However, since the FPCB has various layers such as the conductive portion, the dielectric layer for insulating the conductive portion, the shield layers for shielding the EMI, and so on, the elastic moduli and thicknesses of which are different from each other, it is difficult to find the whole geometric centers.

Here, in order to find the position of the neutral plane, i.e. the line passing through the geometric centers of the materials represented by calculation based on the same elastic modulus, the concept of the geometrical moment of area (i.e. the moment of area) is used. This concept will be described below in greater detail.

The FPCB of the present invention is designed so that the neutral plane is located in the conductive portion as described above, namely within a predetermined range of the thickness of the conductive portion.

The positional relationship between the neutral plane and the conductive portion of the FPCB according to an embodiment of the present invention will be described in greater detail with reference to FIG. 5. The embodiment illustrated in FIG. 5 is merely provided for the illustrative purpose. Thus, the present invention is not limited to this embodiment, and includes the case where each of the first and second dielectric portions has one dielectric layer as well as two or more dielectric layers.

As illustrated in FIG. 5, the thickness and the elastic modulus of the first layer 11 of the FPCB according to an embodiment of the present invention are $T_1$ and $E_1$, respectively.

The thickness and the elastic modulus of the second layer 12 are $T_2$ and $E_2$, respectively. The thickness and the elastic modulus of the third layer 13 are $T_3$ and $E_3$, respectively. Further, the thickness and the elastic modulus of the conductive portion 30 are $T_c$ and $E_c$, respectively.

The thickness and the elastic modulus of the fourth layer 24 are $T_4$ and $E_4$, respectively. The thickness and the elastic modulus of the fifth layer 25 are $T_5$ and $E_5$, respectively.

The widths of these components are equal to each other, and are expressed by L.

Meanwhile, assuming that one outer surface, for instance a lower surface, of the FPCB illustrated in FIG. 5 is a reference surface, the distances from the reference surface to the geometric centers of the respective layers can be expressed by $Y_i$, where "i" is the symbol denoting the respective layers. Specifically, the symbol "i" denotes one of 1, 2, 3, c, 4 and 5.

Here, the geometric centers of the respective layers, of which the FPCB is composed, refer to the distances from the reference surface to the central lines of the respective layers (i.e. lines passing through the centers of thickness of the respective layers) in an uncalculated state, rather than the geometric centers of the respective layers calculated on the basis of the same elastic modulus.

In detail, the distance from the reference surface to the geometric center of the first layer 11 is $Y_1$, the distance from the reference surface to the geometric center of the second layer 12 is $Y_2$, the distance from the reference surface to the geometric center of the third layer 13 is $Y_3$, the distance from the reference surface to the geometric center of the fourth layer 24 is $Y_4$, and the distance from the reference surface to the geometric center of the fifth layer 25 is $Y_5$. Further, the distance from the reference surface to the neutral plane 35 is expressed by $Y_n$.

Thus, $Y_1$ is $T_1/2 + T_2 + T_3 + T_C + T_4 + T_5$, and $Y_2$ is $T_2/2 + T_3 + T_c + T_4 + T_5$. According to the embodiment illustrated in FIG. 5, $Y_i$, i.e. one of the values ranging from Y1 to Y5, is as shown in Tables 1 and 2.

In order to show the positional relationship between the neutral plane and the conductive portion of the FPCB illustrated in FIG. 5, it is necessary to calculate the geometrical moments of area (i.e. the moments of area) of the respective layers of which the FPCB is composed. Here, the geometrical moment of area is defined as the product of the area by the geometric center.

The geometrical moment of area is the concept that is introduced in order to obtain the geometric centers of the whole materials represented by calculating the respective layers, of which the FPCB according to the present invention is composed, on the basis of the same elastic modulus (At this time, the materials represented by calculating the respective layers on the basis of the same elastic modulus may be further increased or decreased in area).

For example, when conversion factors represented by calculating the elastic moduli of the second layer 12, the third layer 13, the conductive portion 30, the fourth layer 24, and the fifth layer 25 on the basis of the elastic modulus of the first layer 11 are applied to the respective layers in FIG. 5, the widths of the respective layers are changed after this calculation. Thus, when the calculated widths are applied to the respective layers, some of the layers are calculated that the areas thereof are further increased, and the other layers are calculated that the areas thereof are further decreased.

When the geometric centers of the materials are found in overall consideration of the calculated materials, the geometric centers are matched with the neutral plane.

In order to obtain the geometric center for the whole materials, the concept of the geometrical moment of area is introduced. Thus, the geometric center is the ratio of an entire area to an entire geometrical moment of area.

The entire area is the cross-sectional area of the materials of the respective calculated layers, or the sum of cross-sectional areas of the respective calculated layers. The entire geometrical moment of area is the sum of the geometrical moments of area of the respective calculated layers.

The following Table 1 shows thicknesses, elastic moduli, conversion factors n, conversion widths, conversion areas, and geometric centers of the respective layers of the FPCB illustrated in FIG. 5. Here, the conversion is based on the elastic modulus $E_1$ of the material of which the first layer 11 is formed.

Further, the geometric centers refer to the distances from the reference surface to the central lines of the respective layers in an uncalculated state.

TABLE 1

|  | T* | EM* | CF* | CW* | CA* | Geometric center |
|---|---|---|---|---|---|---|
| 1st Layer (EMI) | $T_1$ | $E_1$ | 1 | L | $T_1*L$ | $(T_1/2 + T_2 + T_3 + T_c + T_4 + T_5)$ |
| 2nd Layer (polyimide) | $T_2$ | $E_2$ | $E_2/E_1$ | $L* (E_2/E_1)$ | $T_2*L* (E_2/E_1)$ | $(T_2/2 + T_3 + T_c + T_4 + T_5)$ |
| 3rd Layer (adhesive layer) | $T_3$ | $E_3$ | $E_3/E_1$ | $L* (E_3/E_1)$ | $T_3*L* (E_3/E_1)$ | $(T_3/2 + T_c + T_4 + T_5)$ |
| Conductive portion (Cu) | $T_c$ | $E_c$ | $E_c/E_1$ | $L* (E_c/E_1)$ | $T_c*L* (E_c/E_1)$ | $(T_c/2 + T_4 + T_5)$ |
| 4th Layer (polyimide) | $T_4$ | $E_4$ | $E_4/E_1$ | $L* (E_4/E_1)$ | $T_4*L* (E_4/E_1)$ | $(T_4/2 + T_5)$ |
| 5th Layer (EMI) | $T_5$ | $E_5$ | $E_5/E_1$ | $L* (E_5/E_1)$ | $T_5*L* (E_5/E_1)$ | $(T_5/2)$ |

Note)
T*: thickness,
EM*: elastic modulus,
CF*: conversion factor (n),
CW*: conversion width,
CA*: conversion area With regard to the calculation of the respective layers, in the present embodiment, the conversion factor n is applied to the width L, thereby expressing the conversion width. Alternatively, the conversion factor may be applied to the thickness instead of the width, the result of which is the same.

Meanwhile, the following Table 2 shows conversion areas, geometric centers, and the geometrical moments of area. Here, $A_i$ and $M_i$ denote the conversion area of each layer and the geometrical moment of area of each layer respectively, where "i" is the symbol denoting each layer.

TABLE 2

| | CA* | Geometric center | GMA* |
|---|---|---|---|
| $1^{st}$ Layer (EMI) | $A_1 = T_1 * L$ | $Y_1 = (T_1/2 + T_2 + T_3 + T_c + T_4 + T_5)$ | $M_1 = A_1 * Y_1 = T_1 * L * (T_1/2 + T_2 + T_3 + T_c + T_4 + T_5)$ |
| $2^{nd}$ Layer (polyimide) | $A_2 = T_2 * L * (E_2/E_1)$ | $Y_2 = (T_2/2 + T_3 + T_c + T_4 + T_5)$ | $M_2 = A_2 * Y_2 = T_2 * L * (E_2/E_1) * (T_2/2 + T_3 + T_c + T_4 + T_5)$ |
| $3^{rd}$ Layer* (adhesive layer) | $A_3 = T_3 * L * (E_3/E_1)$ | $Y_3 = (T_3/2 + T_c + T_4 + T_5)$ | $M_3 = A_3 * Y_3 = T_3 * L * (E_3/E_1) * (T_3/2 + T_c + T_4 + T_5)$ |
| Conductive portion (Cu) | $A_c = T_c * L * (E_c/E_1)$ | $Y_c = (T_c/2 + T_4 + T_5)$ | $M_c = A_c * Y_c = T_c * L * (E_c/E_1) * (T_c/2 + T_4 + T_5)$ |
| $4^{th}$ Layer (polyimide) | $A_4 = T_4 * L * (E_4/E_1)$ | $Y_4 = (T_4/2 + T_5)$ | $M_4 = A_4 * Y_4 = T_4 * L * (E_4/E_1) * (T_4/2 + T_5)$ |
| $5^{th}$ Layer (EMI) | $A_5 = T_5 * L * (E_5/E_1)$ | $Y_5 = (T_5/2)$ | $M_5 = A_5 * Y_5 = T_5 * L * (E_5/E_1) * (T_5/2)$ |

Note)
CA*: conversion area,
GMA*: Geometrical Moment of Area = Area * Geometric center As shown in Tables 1 and 2, the total area and the total geometrical moment of area for all the layers of the FPCB illustrated in FIG. 5 are expressed as follows:

$$A = \Sigma A_i, \text{ and } M = \Sigma M_i$$

The position of the neutral plane 35 can be expressed as follows.

$$Y_n = M/A = (\Sigma M_i)/(\Sigma A_i)$$

When these formulas are applied in detail, the total area A can be expressed as follows:

$$\Sigma A_i = (A_1 + A_2 + A_3 + A_c + A_4 + A_5)$$
$$= L*(T_1*E_1 + T_2*E_2 + T_3*E_3 + T_c*E_c + T_4*E_4 + T_5*E_5)/E_1$$

The total moment M can be expressed as follows:

$$\Sigma M_i = (M_1 + M_2 + M_3 + M_c + M_4 + M_5)$$
$$= (A_1*Y_1 + A_2*Y_2 + A_3*Y_3 + A_c*Y_c + A_4*Y_4 + A_5*Y_5)$$
$$= L*(T_1*E_1*Y_1 + T_2*E_2*Y_2 + T_3*E_3*Y_3 + T_c*E_c*Y_c + T_4*E_4*Y_4 + T_5*E_5*Y_5)/E_1$$

The position $Y_n$, of the neutral plane 35 can be expressed by the following formula (hereinafter, referred to as "Formula 1").

$$Y_n = (\Sigma M_i)/(\Sigma A_i)$$
$$= T_1*E_1*Y_1 + T_2*E_2*Y_2 + T_3*E_3*Y_3 +$$
$$T_c*E_c*Y_c + T_4*E_4*Y_4 + T_5*E_5*Y_5) \div$$
$$(T_1*E_1 + T_2*E_2 + T_3*E_3 + E_c*E_c + T_4*E_4 + T_5*E_5)$$
$$= (\Sigma(T_i*E_i*Y_i)) \div (\Sigma(T_i*E_i))$$

The neutral plane 35 defined by Formula 1 is designed to be within the thickness range of the conductive portion 30, and preferably to satisfy the following formula (hereinafter, referred to as "Formula 2").

$$\Sigma T_x < Y_n < (\Sigma T_x + T_c) \quad \text{Formula 2}$$

Here, $T_x$ indicates the thickness of each dielectric layer under the conductive portion 30. In the embodiment illustrated in FIG. 5, $T_x$ is the sum of $T_4$ and $T_5$.

In other words, $T_i$, $E_i$, and $Y_i$ are determined such that $Y_n$ is greater than $T_4+T_5$ and is smaller than $T_4+T_5+T_c$. Thus, Yn exists between the lower and upper surfaces of the conductive portion 30.

For example, if the materials of the first dielectric portion 10, the second dielectric portion 20, and the conductive portion 30 are predetermined before the FPCB is manufactured, the elastic modulus $E_i$ of each layer constituting each component is a fixed value, and the thickness of each layer constituting each of the first dielectric portion 10, the second dielectric portion 20, and the conductive portion is determined by Formulas 1 and 2.

The determination of the thickness is conducted by a trial and error method, or by changing the thickness of a changeable layer on the basis of the aforementioned formulas if the thicknesses of some of the layers are fixed, i.e., are not changed. Thereby, the FPCB according to an embodiment of the present invention can be manufactured.

Further, in the case of the cover 40 and the conductive member 50, the elastic modulus is determined by the method similar to the aforementioned method, and the thickness of each layer is determined. The cover 40 and the conductive member 50, prepared on the basis of this determination, are adhered to each other. Thereby, the FPCB according to the present invention can be manufactured.

However, the FPCB according to the present invention has a very thin structure in which its thickness is several microns. As such, although the FPCB is manufactured on the basis of the thicknesses determined by the aforementioned formulas, there is no alternative but to allow a tolerance to some extent.

Thus, the position $Y_n$ of the neutral plane 35 is preferably adapted to be within a range limited to some extent in spite of the thickness range of the conductive portion 30. Thereby, the neutral plane 35 can be matched with the geometric center of the conductive portion 30 as exact as possible, or be spaced apart from the geometric center of the conductive portion 30 as near as possible.

Thus, as illustrated in FIG. 5, the position Yn of the neutral plane is preferably adapted to be determined by the following formula.

$$D_1 \le Y_n \le D_2$$

Here, D1 is preferably selected by a distance ranging from the reference surface to a position corresponding to about 20% of the thickness of the conductive portion, and D2 is preferably selected by a distance ranging from the reference surface to a position corresponding to about 80% of the thickness of the conductive portion. In other words, the position $Y_n$ of the neutral plane is preferably adapted to be determined within a range expressed by the following formula (hereinafter, referred to as "Formula 3").

$$(\Sigma T_x + 0.2 T_c) \le Y_n \le (\Sigma T_x + 0.8 T_c)$$

The reason D1 and D2 are determined as described above is for selecting a more stable range in consideration of the tolerance caused by the manufacturing, rather than the present invention has no effect beyond the range.

Figure 6:
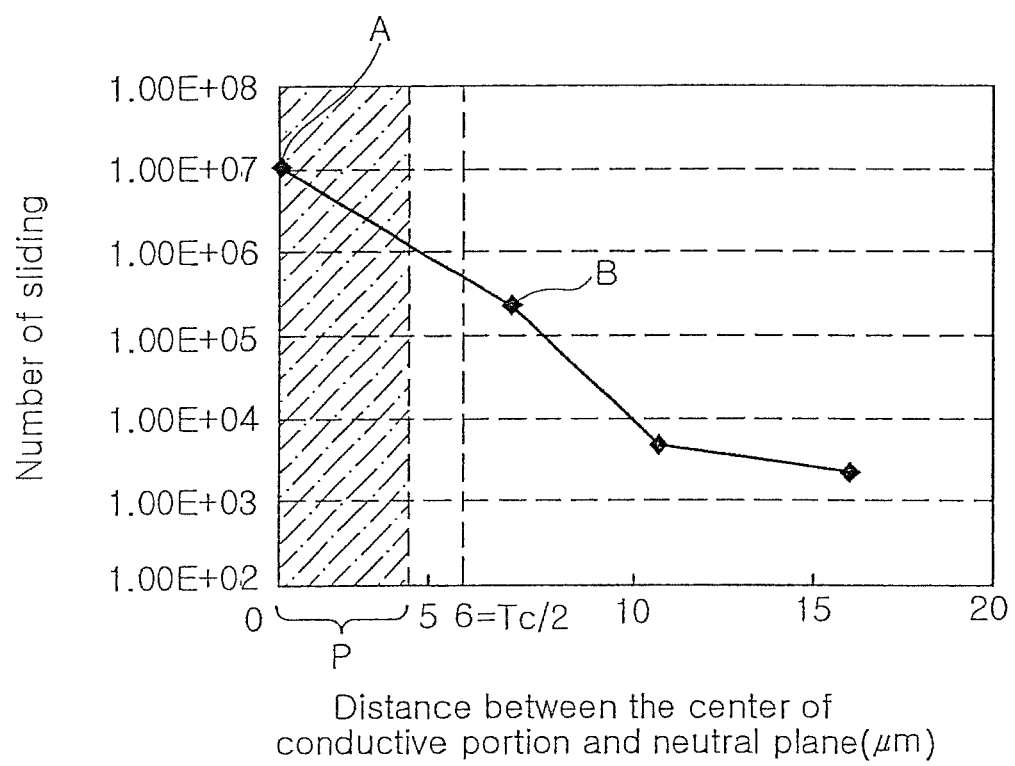
FIG. 6 is a graph illustrating the effects of an FPCB according to an embodiment of the present invention.

Meanwhile, the effects of the FPCB according to an embodiment of the present invention will be described with reference to FIG. 6. FIG. 6 shows the results of lifespan prediction simulation performed on an FPCB according to an embodiment of the present invention and a known FPCB.

In the graph shown in FIG. 6, the abscissa denotes a distance between the geometric center of the conductive portion and the neutral plane in unit of micron, and the ordinate denotes the number of times of repeating bending using a slide.

Further, the symbol A corresponds to the case where the geometric center of the conductive portion and the neutral plane of the FPCB according to an embodiment of the present invention are matched with each other, and the symbol B denotes the result of a bending test of the known FPCB.

The graph shown in FIG. 6 is obtained by simulating the case where the thickness $T_c$ of the conductive portion 30 is set to 12 µm. When the value of the abscissa is zero (0), this denotes the case where the neutral plane is matched with the geometric center of the conductive portion. As it proceeds to the right side on the basis of the zero value of the abscissa, this denotes that the neutral plane is gradually spaced apart from the geometric center of the conductive portion in an upward or downward direction.

For example, if the neutral plane is spaced 5 µm apart from the geometric center of the conductive portion in a downward direction, the number of times of repeating the bending using the slide corresponding to 5 of the abscissa on the graph shown in FIG. 6 becomes a predicted lifespan. If the neutral plane is spaced 5 µm apart from the geometric center of the conductive portion in an upward direction, the number of times of repeating the bending using the slide corresponding to 5 on the abscissa of the graph shown in FIG. 6 also becomes a predicted lifespan.

In other words, the range from 0 µm to 6 µm on the abscissa of the graph shown in FIG. 6 is the thickness range of the conductive portion. The symbol P of the graph denotes the range between $D_1$ and $D_2$ illustrated in FIG. 5.

As shown in FIG. 6, although the neutral plane is within the thickness range (from 0 µm to 6 µm) of the conductive portion, the lifetime of the FPCB of the present invention is longer than that of the conventional FPCB. Even in the range of P, it is possible to achieve better effects than the conventional FPCB.

When the range of $D_1$ and $D_2$ are selected to be between 20% and 80% of the thickness of the conductive portion as described above, P in the graph of FIG. 6 approximately ranges from 0 to 4.8.

The present invention aims to locate the conductive portion in a plane, the elastic modulus of which is substantially zero (0). This plane indicates the interface between one portion under tension and another portion under compression when bending occurs, or the neutral plane which is not subjected to tension or compression in response to bending. Here, the neutral plane has zero (0) elastic modulus.

Since the conductive portion has a predetermined thickness, all of the conductive portion cannot serve as the neutral plane. When the FPCB of the present invention is bent, a small amount of tension and compression will be applied to the conductive portion, thereby deforming the same in a very small range.

The present invention is directed to finally match the neutral plane to the geometric center of the conductive portion. When the neutral plane is not consistent with but close vicinity to the geometric center of the conductive portion, the conductive portion is not free from stress or strain in the bending. However, as shown in FIG. 6, the stress applied to the conductive portion will be very small, and the strain will be close to 0, so that substantially no deformation occurs in the conductive portion, thereby increasing the lifetime of the FPCB.

Table 3 below shows the result of lifetime experiments, performed on FPCB specimens according to an embodiment of the present invention. Here, the distance between the geometric center and the neutral plane was 4.00 µm in four of the specimens, and 1.26 µm in two of the specimens.

TABLE 3

| Distance from neutral plane | 1 | 2 | 3 | 4 |
|---|---|---|---|---|
| 4.00 µm | 163,600 | 157,400 | 173,300 | 151,100 |
| 1.26 µm | 331,800 | 354,600 | | |

From the data reported in Table 3 above, it can be appreciated that the average lifetime of the 4.00 µm specimens is 161,350 times, and the average lifetime of the 1.26 µm specimens is 343,200 times.

That is, the experiments reveal that the lifetime of the conductive portion against bending may increase as the geometric center thereof is farther from the neutral plane.

Referring to the drawings, the method of manufacturing an FPCB of the present invention will be described in more detail.

The method of manufacturing an FPCB of the present invention basically includes determining the thickness and the elastic modulus of respective layers (i.e., dielectric, adhesive and conductive layers) of the FPCB so that the neutral plane is located within the thickness or a predetermined range of the thickness of the conductive portion, and manufacturing the FPCB according to the determined values of thickness and elastic modulus.

Accordingly, method of manufacturing an FPCB of the present invention can be generally divided into two types.

First type is to manufacture an FPCB by suitably determine the thickness and elastic modulus of a first dielectric portion, a second dielectric portion and a conductive portion (or a cover and a conductive member), and locating a neutral plane within a predetermined range of the thickness of the conductive portion. Second type is to stack a suitable thickness of dielectric layer (or shield layer) on a previously made FPCB so that a neutral plane is located within a predetermined range of the thickness of a conductive portion.

A first type embodiment of the manufacturing method was already described with reference to FIG. 5.

That is, the thickness and elastic modulus of respective layers are determined based upon above-described Formulae, such as Formulae 1 and 2 or Formulae 1 and 3, and an FPCB is manufactured according to the determined values.

Here, it is frequent that the material of the respective dielectric or shield layer is previously determined. When the material is previously determined, the elastic modulus is automatically determined as a unique value of the respective material, and it is required to determine only the thickness of the respective layer. The geometric center can be easily calculated when the thickness and elastic modulus of the respective layer is determined. The position $Y_n$ of the neutral plane is obtained according to Formula 1 above, and it is designed so that the position $Y_n$ is present in a predetermined range of the thickness of the conductive portion.

If not only the elastic modulus of the respective layers but also the thickness of any of the layers are fixed, the thickness of the layer, which is variable, can determined according to above-described Formulae 1 and 2 or Formulae 1 and 3 in order to manufacture an FPCB.

Now, a second type embodiment of the method of manufacturing an FPCB will be described with reference to FIGS. 7 and 8.

Figure 7:
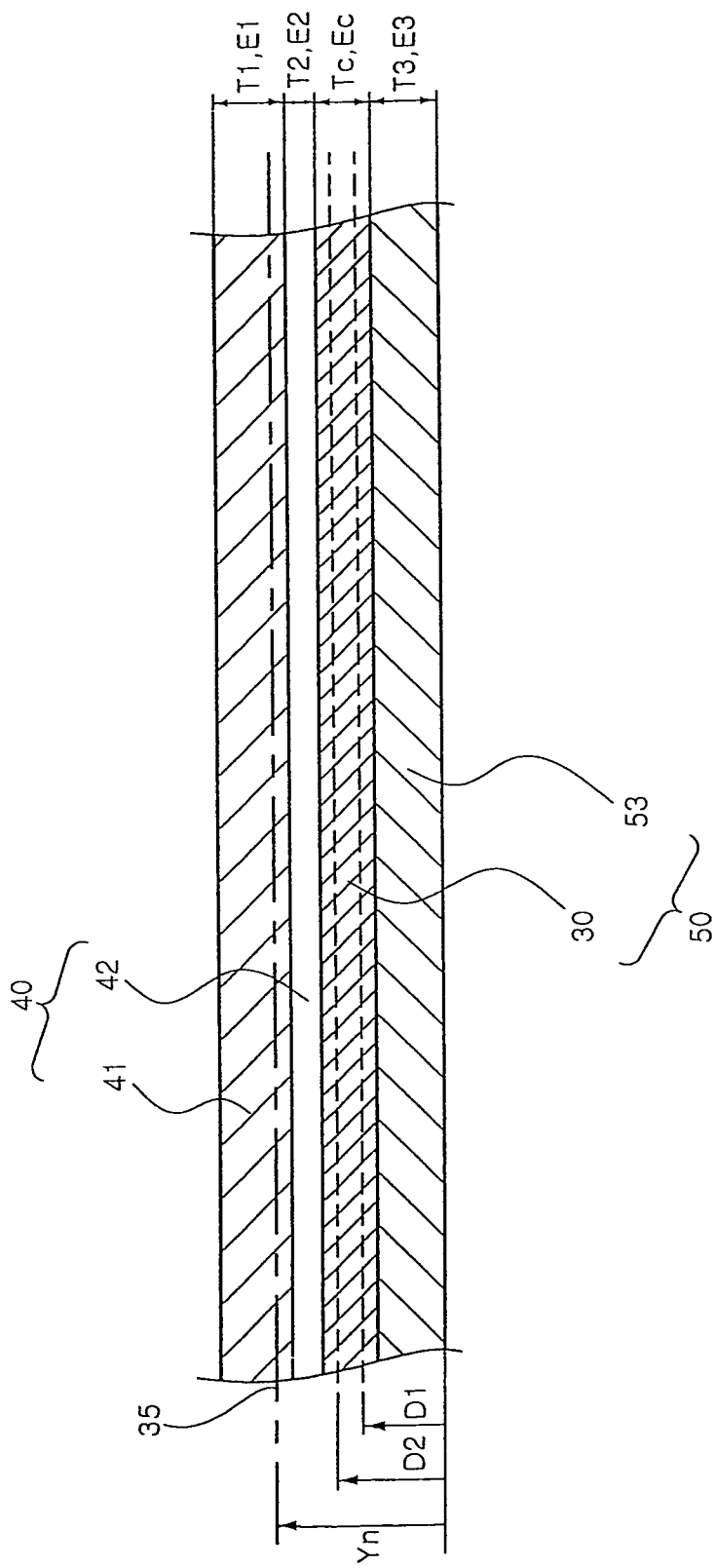
FIGS. 7 and 8 are cross-sectional views illustrating a method of manufacturing an FPCB according to another embodiment of the present invention.

As shown in FIG. 7, the FPCB includes a cover 40 and a conductive member 50, in which the cover 40 includes first and second layers 41 and 42, and the conductive member 50 includes a conductive portion 30 and a third layer 50.

The first layer 41 has a thickness $T_1$ and an elastic modulus $E_1$, the second layer 42 has a thickness $T_2$ and an elastic modulus $E_2$, the conductive portion 30 has a thickness $T_c$ and an elastic modulus $E_c$, and the third layer 53 has a thickness $T_3$ and an elastic modulus $E_3$.

The position $Y_n$ of the neutral plane 35 is not present in the range between $D_1$ and $D_2$ of the conductive portion 30. That is, neutral plane 35 is spaced from the conductive portion 30 at a predetermined distance, and this represents that the conductive portion 30 is greatly subjected to tension or compression by bending.

This embodiment is directed to a manufacturing method, which causes the neutral plane 35 to be located in the range between $D_1$ and $D_2$ by suitably adding a dielectric layer or a shield layer to the FPCB, in the state shown in FIG. 7.

Figure 8:
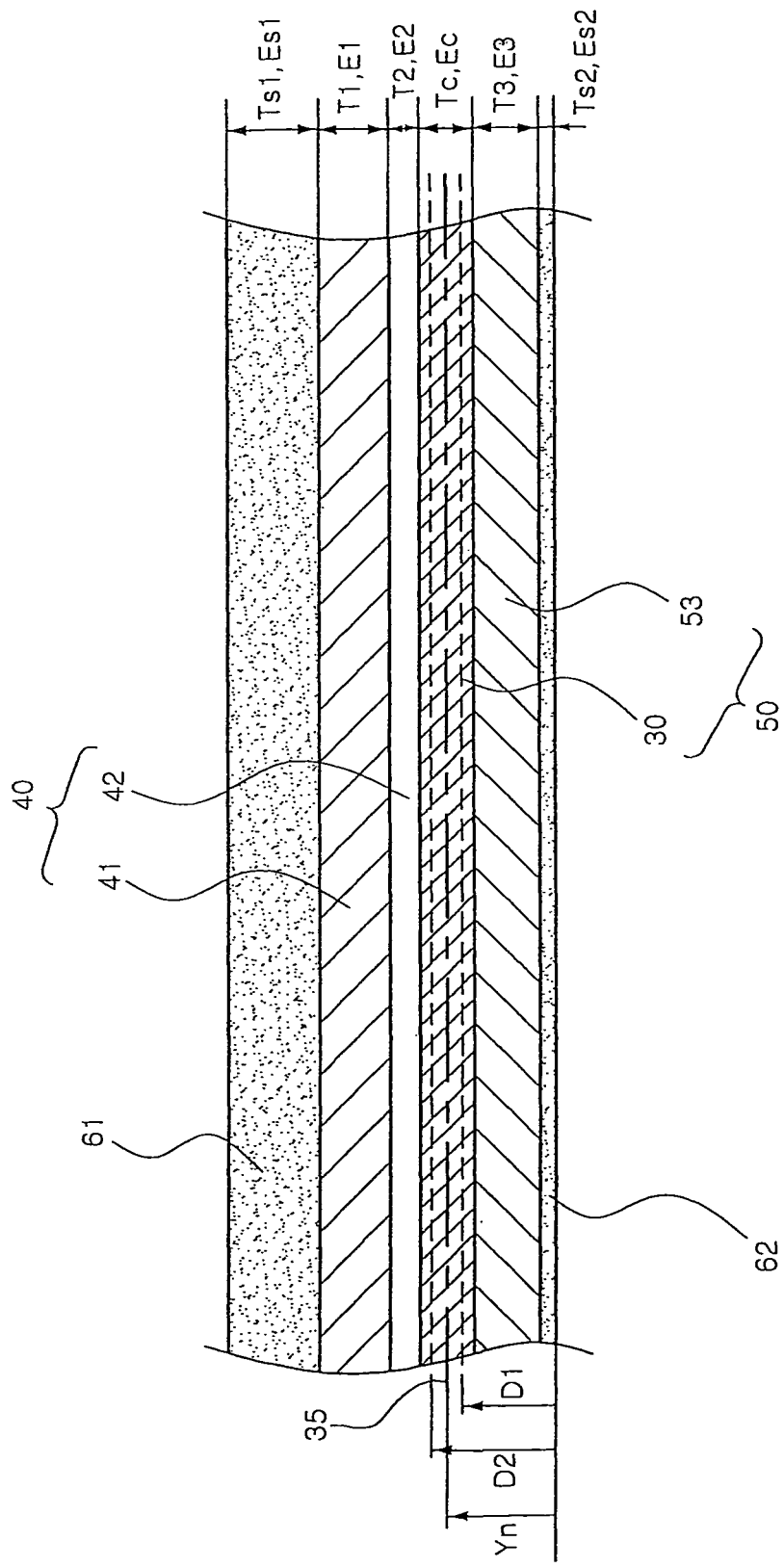

As shown in FIG. 8, the method of manufacturing an FPCB involves suitably layering a shield on at least one of the top surface and the underside of the FPCB shown in FIG. 7, so that the neutral plane 35 is located within a predetermined range of the thickness of the conductive portion 30.

Referring to FIG. 8, it is illustrated that the position of the neutral plane 35 is adjusted using the shield, that is, a first shield 61 layered on the top surface of the cover 40 and a second shield 62 layered on the underside surface of the conductive member 50.

Preferably, the thickness and the elastic modulus of the first and second shields 61 and 62 can be determined based upon Formula 1 and/or Formula 2 above.

The first shield 61 has a thickness $T_{s1}$ and an elastic modulus $E_{s1}$, the second shield 62 has a thickness $T_{s2}$ and an elastic modulus $E_{s2}$. These values will be determined in the following.

The thickness $T_1$ and elastic modulus $E_1$ of the first layer 41, the thickness $T_2$ and elastic modulus $E_2$ of the second layer 42, the thickness $T_c$ and elastic modulus $E_c$ of the conductive layer 30, and the thickness $T_3$ and elastic modulus $E_3$ of the third layer 53 are previously determined.

When the values $T_{s1}$, $E_{s1}$, $T_{s2}$ and $E_{s2}$ are inputted, respectively, into Formula 1:

$$Y_n = (\Sigma(T_i * E_i * Y_i))/(\Sigma(T_i * E_i))$$

$Y_{s1}$ (the distance from a reference plane to the geometric center of the first shield 61) can be expressed as in the following Formula:

$$Y_{s1} = T_{s1}/2 + T_1 + T_2 + T_c + T_3 + T_{s2}$$

In addition, $Y_{s2}$ (the distance from the reference plane to the geometric center of the second shield 61) can be expressed as in the following Formula:

$$Y_{s2} = T_{s2}/2$$

As described above, a suitable value is selected based on the relation with the position Yn of the neutral plane by inputting $T_{s1}$, $E_{s1}$, $Y_{s1}$, $T_{s2}$, $E_{s2}$ and $Y_{s2}$. It is preferable that the value of $Y_n$ satisfy Formula 2 or Formula 3 above.

That is, the values $T_{s1}$, $E_{s1}$, $T_{s2}$ and $E_{s2}$ are determined by suitably selecting from above-mentioned formulas, and based upon the determined values, the first shield 61 and the second shield 62 are layered on the FPCT as shown in FIG. 7, so that the neutral plane 35 can be located within a predetermined range of the thickness of the conductive portion 30 as shown in FIG. 8.

While the present invention has been shown and described in connection with the exemplary embodiments, it will be apparent to those skilled in the art that modifications and variations can be made without departing from the spirit and scope of the present invention as defined by the appended claims.

What is claimed is:

1. A method of manufacturing a flexible printed circuit board, comprising:
   determining an elastic modulus of a conductive portion and an elastic modulus of first and second dielectric portions, which insulate the conductive portion;
   determining a thickness of the conductive portion and the first and second dielectric portions so that a neutral plane is located within a predetermined range of the thickness of the conductive portion, the neutral plane being substantially free from tension or compression in response to bending of the flexible printed circuit board; and
   insulating the conductive portion according to the determined thickness and the determined elastic modulus,
   wherein
   the thicknesses of the first dielectric portion, the second dielectric portion and the conductive portion is determined according to the position of the neutral plane, which is obtained by the following formula:

$$Y_n = (\Sigma(T_i * E_i * Y_i))/(\Sigma(T_i * E_i)), \text{ and}$$

$$\Sigma T_x < Y_n < (\Sigma T_x + T_c),$$

where $Y_n$ is a distance normally extending from a reference plane to the neutral plane, $T_i$ is the thickness of a respective layer of the flexible printed circuit board, $E_i$ is an elastic modulus of a material placed in the respective layer of the flexible printed circuit board, $Y_i$ is a distance normally extending from the reference plane to the geometric center of the respective layer, $T_x$ is the thickness of the respective layer under the conductive portion, $T_c$ is the thickness of the conductive portion, and the reference plane is an underside of the flexible printed circuit board.

2. The method claim 1, wherein the determining of the thickness comprises locating the neutral plane in a range determined by the following Formula:

$$(\Sigma T_x + 0.2 T_c) \leq Y_n \leq (\Sigma T_x + 0.8 T_c).$$

* * * * *

UNITED STATES PATENT AND TRADEMARK OFFICE
CERTIFICATE OF CORRECTION

PATENT NO.        : 8,832,929 B2
APPLICATION NO.   : 13/472937
DATED             : September 16, 2014
INVENTOR(S)       : Kyung Ho Lee et al.

It is certified that error appears in the above-identified patent and that said Letters Patent is hereby corrected as shown below:

In the Claims:

Column 15, Line 7, In Claim 2, delete "method" and insert -- method of --, therefor.

Signed and Sealed this
Seventh Day of April, 2015

Michelle K. Lee
*Director of the United States Patent and Trademark Office*